(12) United States Patent
Koyama

(10) Patent No.: US 10,193,543 B2
(45) Date of Patent: Jan. 29, 2019

(54) ELECTRONIC DEVICE AND METHOD OF CONTROLLING SWITCHING ELEMENTS

(71) Applicant: CANON KABUSHIKI KAISHA, Tokyo (JP)

(72) Inventor: Tadashi Koyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/345,994

(22) Filed: Nov. 8, 2016

(65) Prior Publication Data

US 2017/0141774 A1    May 18, 2017

(30) Foreign Application Priority Data

Nov. 16, 2015 (JP) ................... 2015-224230

(51) Int. Cl.
*H03K 17/687* (2006.01)
*H03K 17/16* (2006.01)
*H03K 17/06* (2006.01)

(52) U.S. Cl.
CPC ......... *H03K 17/165* (2013.01); *H03K 17/063* (2013.01); *H03K 2017/066* (2013.01); *H03K 2217/0027* (2013.01)

(58) Field of Classification Search
None
See application file for complete search history.

(56) References Cited

U.S. PATENT DOCUMENTS

| 8,456,143 B2* | 6/2013 | Nakashima | H02M 3/1588 323/224 |
| 2015/0061615 A1* | 3/2015 | Michishita | H02M 3/1588 323/271 |

FOREIGN PATENT DOCUMENTS

JP    2013-013051 A    1/2013

* cited by examiner

*Primary Examiner* — Long Nguyen
(74) *Attorney, Agent, or Firm* — Venable, LLP

(57) ABSTRACT

An electronic device includes a first switching element connected between a power source and one end of a power inductor, a second switching element connected between the one end of the power inductor and ground, a detection unit that detects a current flowing to the second switching element when a period in which the first switching element is in an off-state and the second switching element is in an on-state, and a control unit. The control unit uses the detected current to gradually decrease an on-resistance of the first switching element, when the first switching element is changed from the off-state to an on-state, and uses the detected current to gradually increases an on-resistance of the second switching element, when the second switching element is changed from the on-state to an off-state.

20 Claims, 10 Drawing Sheets

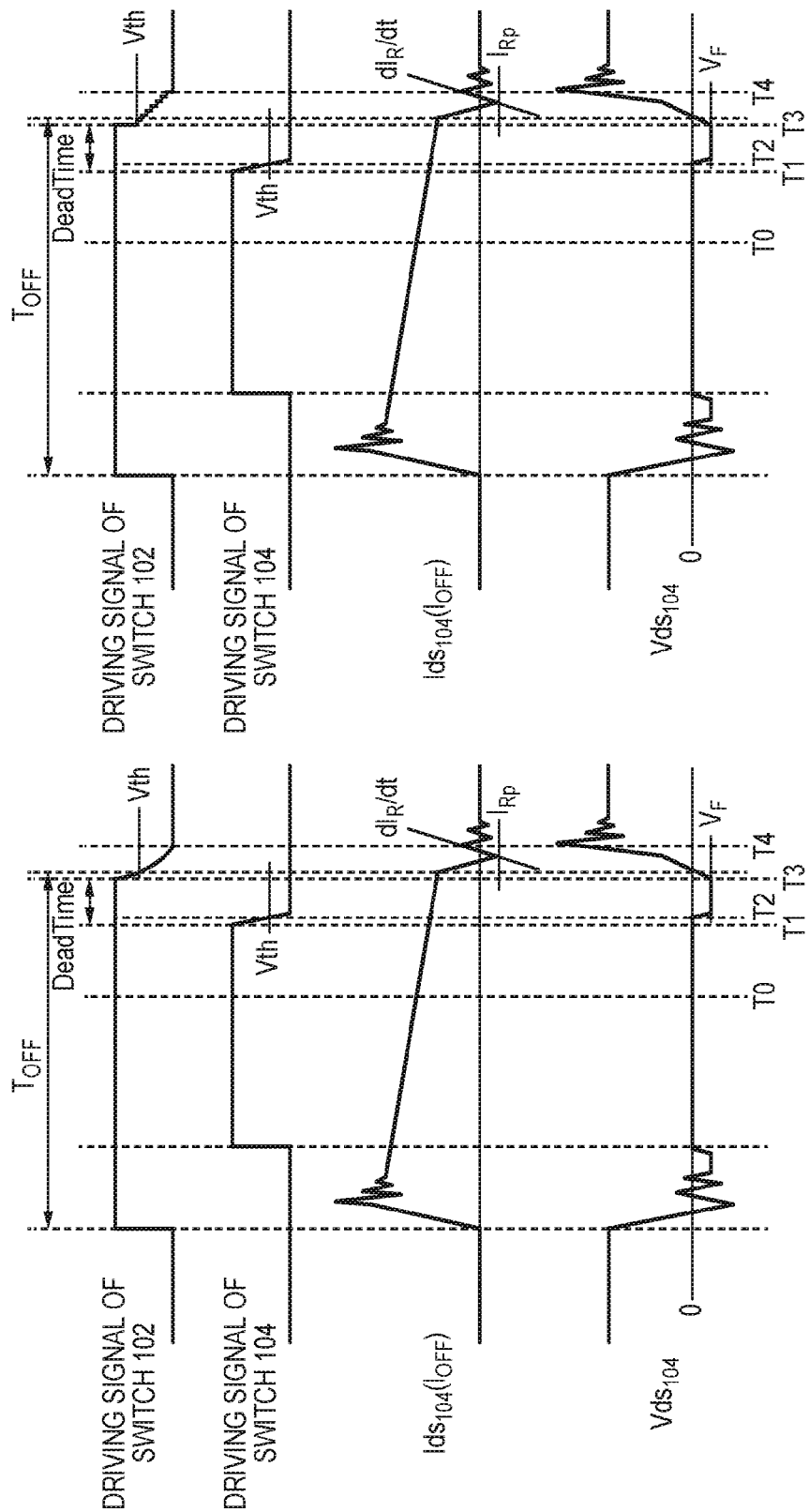

| DRIVING MODE | OnSlewRateTime | $I_{OFF}$ [A] |
|---|---|---|
| 1 | +0 nsec | 0 – 0.1 |
| 2 | +5 nsec | 0.1 – 0.2 |
| 3 | +10 nsec | 0.2 – 0.5 |
| 4 | +15 nsec | 0.5 – 1.0 |
| 5 | +20 nsec | 1.0 – 2.0 |

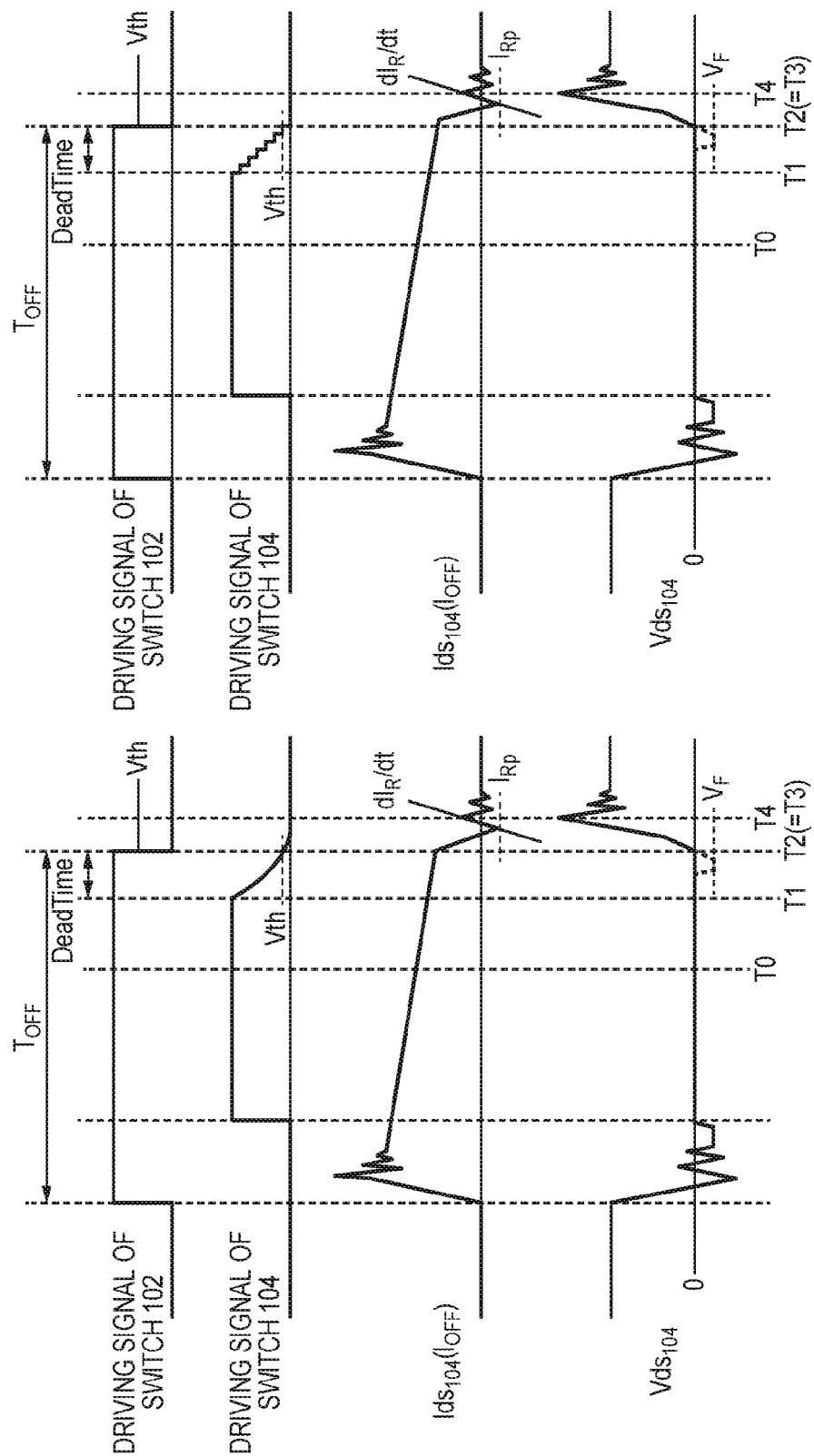

| DRIVING MODE | OffSlewRateTime | $I_{OFF}$ [A] |
|---|---|---|
| 1 | +0 nsec | 0 – 0.1 |
| 2 | +5 nsec | 0.1 – 0.2 |
| 3 | +10 nsec | 0.2 – 0.5 |
| 4 | +15 nsec | 0.5 – 1.0 |
| 5 | +20 nsec | 1.0 – 2.0 |

FIG. 9

| DRIVING MODE | OnSlewRateTime | OffSlewRateTime | $I_{OFF}[A]$ |
|---|---|---|---|
| 1 | +0 nsec | +0 nsec | 0 – 0.1 |
| 2 | +2 nsec | +5 nsec | 0.1 – 0.2 |
| 3 | +4 nsec | +10 nsec | 0.2 – 0.5 |
| 4 | +6 nsec | +15 nsec | 0.5 – 1.0 |
| 5 | +8 nsec | +20 nsec | 1.0 – 2.0 |

ELECTRONIC DEVICE AND METHOD OF CONTROLLING SWITCHING ELEMENTS

BACKGROUND

Field of the Invention

Aspects of the present invention relate to an electronic device including a power supply device, and a method of controlling switching elements.

Description of the Related Art

The integration of a large scale integrated circuit (to be referred to as an LSI hereinafter) has been advanced along with the progress of design and manufacturing techniques, thereby allowing implementation of advanced functions by one chip. On the other hand, the voltage has decreased along with the miniaturization of manufacturing processes and the load current has increased along with improvement in functionality. Thus, the power supply system of an electronic device has been more strictly required to improve the efficiency and reduce noise.

In the power supply system, as the load current increases, a reverse current flowing to the parasitic diode of a switching MOSFET (metal-oxide-semiconductor field-effect transistor) increases. The reverse current will be referred to as a "recovery current" hereinafter. In accordance with the recovery characteristic of a p-n junction diode, energy which is accumulated in the parasitic inductance of wirings and released at the end of recovery also increases. As a result, high-frequency ringing noise in a switch node increases due to LC resonance of the parasitic inductance and the stray capacitance of a wiring loop including the MOSFET. This tendency becomes more significant as the load current increases.

As a method of improving the efficiency of the power supply system, there is known a technique of connecting in parallel MOSFETs for switching and performing multistage control to reduce the conduction losses of the MOSFETs. However, the parallel connection of the MOSFETs increases the parasitic inductance of a wiring loop including the MOSFETs, and increases energy which is accumulated in the parasitic inductance of the wirings and released at the end of recovery, thereby increasing ringing noise, as described above. The ringing noise causes electromagnetic interference (EMI), and thus noise radiated from the housing of the electronic device into space is concerned. Japanese Patent Laid-Open No. 2013-13051 describes a technique of reducing ringing noise by limiting the rise of the driving voltage of the switching element.

SUMMARY

Limiting the rise of the driving voltage of the switching element advantageously reduces ringing noise generated at the time of switching but disadvantageously increases transition loss occurring at the time of switching. If the rise of the driving voltage is kept limited even after the end of recovery of the parasitic diode, the disadvantage that the transition loss occurring at the time of switching is increased remains. Since the ringing noise generated at the time of switching increases in proportion to a load, if the load is light or a load variation is large, the transition loss occurring at the time of switching may increase while the reduction effect of the ringing noise generated at the time of switching can be hardly obtained. Furthermore, in the driving mode of the electronic device in which power saving at the time of device driving is desirably prioritized over a reduction in noise radiation, the transition loss occurring at the time of switching is increased by limiting the rise of the driving voltage of the switching element, and thus it is difficult to save the power.

According to an aspect of the present invention, it is possible to reduce ringing noise, transition loss, or both occurring at the time of switching.

According to an aspect of the present invention, an electronic device includes: a first switching element connected between a power source and one end of a power inductor; a second switching element connected between the one end of the power inductor and ground; a detection unit that detects a current flowing to the second switching element when a period in which the first switching element is in an off-state and the second switching element is in an on-state; and a control unit (a) uses the detected current to gradually decrease an on-resistance of the first switching element, when the first switching element is changed from the off-state to an on-state, and (b) uses the detected current to gradually increases an on-resistance of the second switching element, when the second switching element is changed from the on-state to an off-state.

According to an aspect of the present invention, a method includes: detecting a current flowing to a second switching element when a period in which a first switching element is in an off-state and the second switching element is in an on-state; causing a control unit to use the detected current to gradually decrease an on-resistance of the first switching element, when the first switching element is changed from the off-state to an on-state; and causing the control unit to use the detected current to gradually increases an on-resistance of the second switching element, when the second switching element is changed from the on-state to an off-state, wherein the first switching element is connected between a power source and one end of a power inductor, and the second switching element is connected between the one end of the power inductor and ground.

Further features and aspects of the present invention will become apparent from the following description of exemplary embodiments.

BRIEF DESCRIPTION OF THE DRAWINGS

FIG. 3 is a timing chart illustrating an operation of the DC-DC converter 218a;

FIG. 5A is a timing chart illustrating operations of a switch 102 (upper side switch) and the switch 104 (lower side switch) when OnSlewRateTime is prolonged;

FIG. 5B is another timing chart illustrating operations of the switch 102 (upper side switch) and the switch 104 (lower side switch) when OnSlewRateTime is prolonged;

FIG. 7A is a timing chart illustrating operations of the switch 102 (upper side switch) and the switch 104 (lower side switch) when OffSlewRateTime is prolonged;

FIG. 7B is another timing chart illustrating operations of the switch 102 (upper side switch) and the switch 104 (lower side switch) when OffSlewRateTime is prolonged;

FIG. 9 is a table showing an example of a SlewRateTime table according to the third embodiment.

DESCRIPTION OF THE EMBODIMENTS

Exemplary embodiments, features, and aspects of the present invention will be described below with reference to the drawings. However, aspects of the present invention are not limited to the following embodiments.

First Embodiment

[Description of Electronic Device 200]

Figure 1:
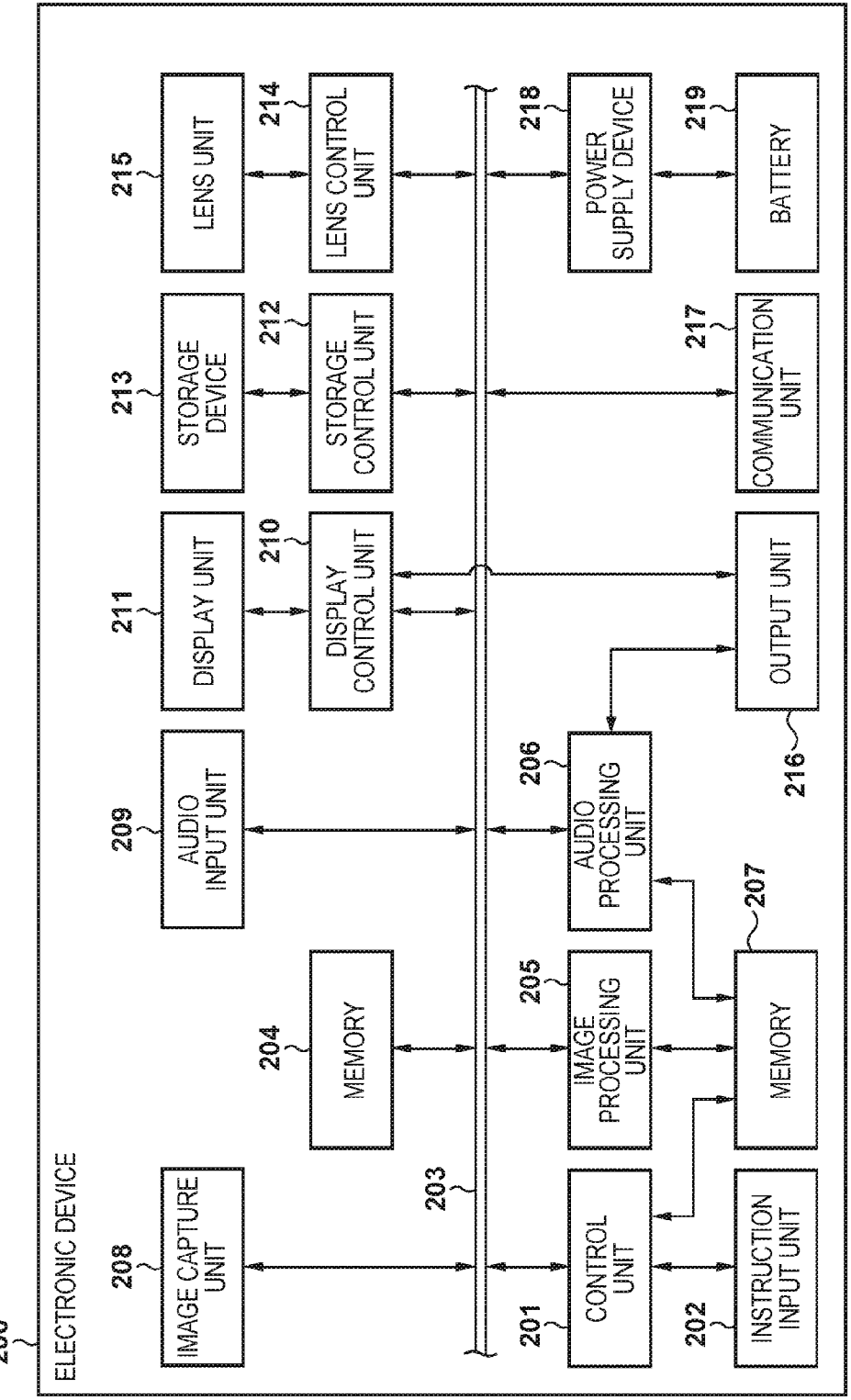
FIG. 1 is a block diagram illustrating components of an electronic device 200 according to first to third embodiments.

FIG. 1 is a block diagram illustrating components of an electronic device 200 according to first to third embodiments. The electronic device 200 can act as, for example, an image capture device. A mobile device or mobile phone capable of acting as a digital camera is an example of the electronic device 200.

A battery 219 is a power supply used to supply power to a power supply device 218, and a power supply used to drive the electronic device 200. The battery 219 may be detachable from the electronic device 200, or may be incorporated in the electronic device 200. The power supply device 218 includes DC-DC converters. Each of the DC-DC converters included in the power supply device 218 can boost up or down the output voltage of the battery 219, and supply predetermined voltage and current to predetermined components of the electronic device 200 by performing predetermined sequence control.

A control unit 201 uses a memory 204 as a work memory to execute one or more programs stored in a memory 207 and the like in accordance with an instruction from an instruction input unit 202. The control unit 201 controls all the components of the electronic device 200 via an internal bus 203, thereby controlling data transfer between all the components. Note that the control unit 201 may be a one-chip microcomputer including a CPU (central processing unit) and a memory. The internal bus 203 is a bus for transmitting/receiving various data, control signals, instruction signals, and the like between all the components of the electronic device 200.

The instruction input unit 202 includes, for example, a power-on button, a recording start button, a zoom adjustment button, and an auto focus button, and can input an instruction related to an image capturing to the electronic device 200. The instruction input unit 202 further includes a menu display button, a determination button, cursor keys, a pointing device, and a touch panel. The instruction input unit 202 notifies the control unit 201 of an instruction input by the user.

An image capture unit 208 includes an image capture device (CCD or CMOS image sensor) and an A/D converter, and generates image data from an optical image of an object captured through a lens unit 215. An audio input unit 209 generates audio data from sound collected by a microphone device included in the electronic device 200 or an external microphone device connected to the audio input terminal of the electronic device 200. The image data and audio data are temporarily stored in the memory 204 such as a DRAM or an SRAM.

An image processing unit 205 executes an image process (to be described later) necessary for recording/reproduction of a moving image or still image. An audio processing unit 206 executes an audio process (to be described later) necessary for recording/reproduction of sound. Note that the image process and audio process (both will be described later) may be executed as some functions of the control unit 201.

A display control unit 210 performs display control to display a moving image or still image on a display unit 211, thereby reading out the image data stored in the memory 204 and displaying an image represented by the image data on the display unit 211. The display unit 211 includes a liquid crystal panel or an organic electroluminescence (OEL) panel. A display device (e.g., a television, a monitor, or a projector) different from the electronic device 200 can be used as the display unit 211.

A storage control unit 212 records moving image data, audio data, or still image data in a storage device 213 in an image capture mode, and reads out moving image data, audio data, or still image data from the storage device 213 in a reproduction mode. The storage device 213 may be a storage device incorporated in the electronic device 200 or a storage device detachable from the electronic device 200. A hard disk device, an optical device, a flash memory, or the like is an example of the storage device 213.

An output unit 216 includes a loudspeaker, an audio output terminal, and an image output terminal. A communication unit 217 can perform data communication with an external device via a wired or wireless network.

The lens unit 215 includes a lens for capturing an optical image of an object into the electronic device 200, a stop mechanism for controlling a light amount, a focus mechanism for focusing on an object image, and a shutter mechanism for controlling the exposure time of the image capture device. A lens control unit 214 controls the lens unit 215 based on a control signal from the control unit 201.

The image processing unit 205 performs a development process including demosaicing for the image data which has been acquired by the image capture unit 208 and stored in the memory 204, and performs an image quality adjustment process of correcting the white balance, color, brightness, and the like based on user setting values and setting values determined from an image characteristic. The image processing unit 205 generates still image data from the image data having undergone the image quality adjustment process, and generates moving image data using, as a frame image, each image data having undergone the image quality adjustment process.

A coding method such as JPEG is used to generate still image data. Note that as still image data, RAW image data may be used.

As for generation of moving image data, moving image data may be generated by performing intra-frame coding of each frame image, or by using the difference between frames, motion prediction, and the like. For example, moving image data complying with a predetermined coding method (e.g., Motion JPEG, MPEG, or H.264 (MPEG-4 Part 10 AVC)) can be generated.

The moving image data and still image data generated by the image processing unit 205 are stored in an area other than an area of the memory 204 where the above-described image data and audio data are stored. Note that an example in which the image data, the audio data, and the moving image data and still image data generated by the image processing unit 205 are stored in the same memory 204 will be described. However, these data may be stored in different memories.

The audio processing unit 206 performs a level optimization process, a noise reduction process, and the like of the audio data which has been acquired by the audio input unit 209 and stored in the memory 204, and performs a coding process of the audio data by an audio coding method such as AC-3 or AAC, as needed. The audio data processed by the audio processing unit 206 is stored in the memory 204 again.

If the control unit 201 inputs the moving image data, audio data, and still image data read out from the memory 204, the storage control unit 212 records the data in the storage device 213. At this time, the still image data is recorded in the storage device 213 as a still image file, and the moving image data and the audio data are recorded in the storage device 213 as one moving image file. The storage control unit 212 can record, in the storage device 213, together with the moving image data, audio data, and still image data, various data indicating camera settings, detection data, and the like at the time of an image capturing, which have been generated by the control unit 201.

In a moving image reproduction mode, the storage control unit 212 supplies, to the control unit 201, pieces of header information of moving image files recorded in the storage device 213. Based on the pieces of header information, the control unit 201 controls the storage control unit 212 so as to read out, from the storage device 213, the moving image file of a moving image to be reproduced.

The storage control unit 212 supplies the moving image data of the readout moving image file to the image processing unit 205, and supplies the audio data to the audio processing unit 206. The image processing unit 205 sequentially stores the frame images of the moving image data in the memory 204. The display control unit 210 sequentially loads the frame images stored in the memory 204 to display them on the display unit 211 or supply them to the output unit 216 (the image output terminal or the like).

The audio processing unit 206 decodes audio data into a digital audio signal, converts the audio signal into an analog signal, and supplies the analog audio signal to the output unit 216 (the loudspeaker, the earphone terminal, the audio output terminal, or the like).

In a still image reproduction mode, the storage control unit 212 supplies, to the control unit 201, pieces of header information of still image files recoded in the storage device 213. Based on the pieces of header information, the control unit 201 controls the storage control unit 212 so as to read out, from the storage device 213, the still image file of a still image to be reproduced.

The storage control unit 212 supplies the still image data of the readout still image file to the image processing unit 205. The image processing unit 205 stores, in the memory 204, image data obtained by decoding the still image data. The display control unit 210 loads the image data stored in the memory 204 to display it on the display unit 211 or supply it to the output unit 216 (the image output terminal or the like).

[Description of Power Supply Device 218]

Figure 2:
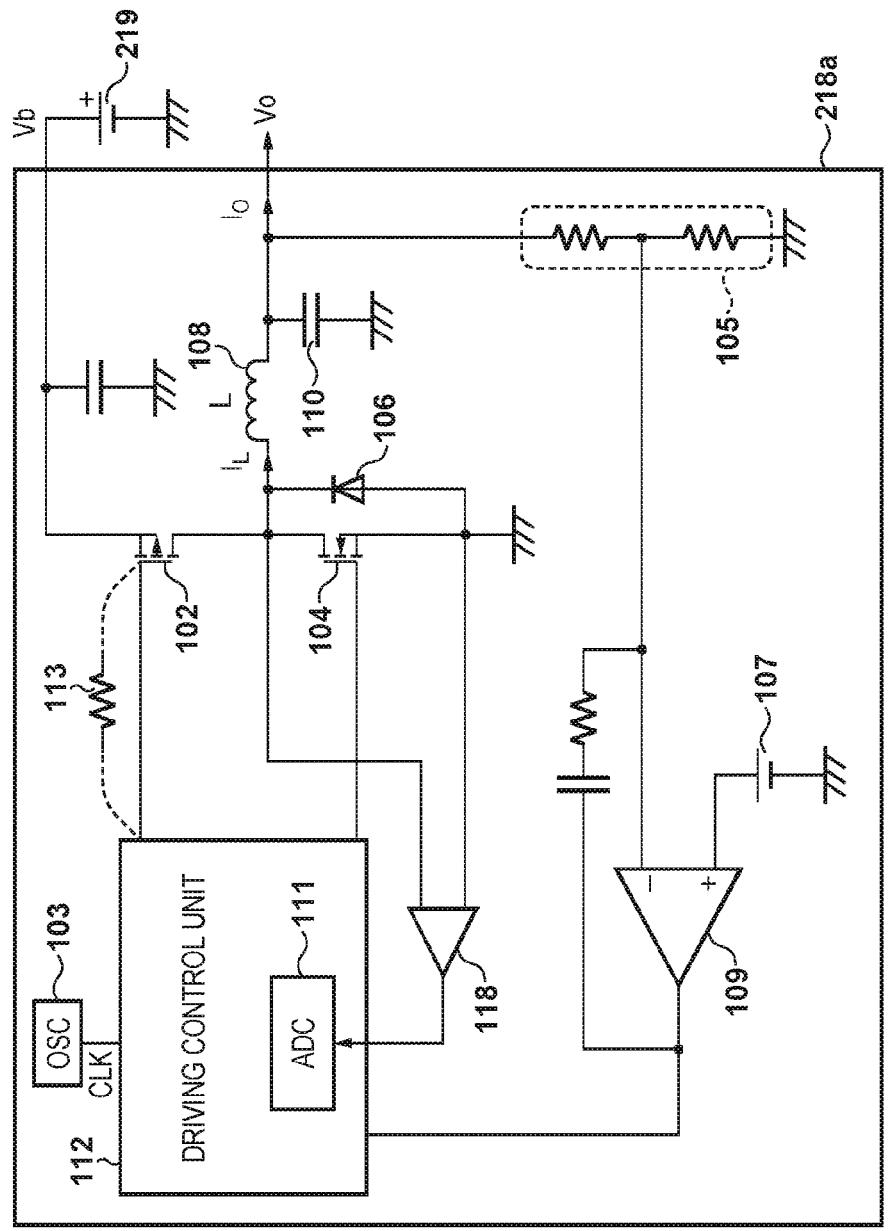
FIG. 2 is a diagram illustrating components of a DC-DC converter 218a included in a power supply device.

The power supply device 218 is a source for generating ringing noise, and includes DC-DC converters in correspondence with differences in output voltage Vo and/or power supply destinations. The DC-DC converters included in the power supply device 218 have different output voltages Vo or different power supply destinations. Components of a DC-DC converter 218a, that is one of the DC-DC converters included in the power supply device 218, will be described with reference to FIG. 2.

The DC-DC converter 218a is a synchronous rectification step-down power supply circuit for supplying driving power to a device of the succeeding stage. A feedback mechanism for maintaining a voltage is implemented by controlling pulse width modulation (PWM) in accordance with a voltage loop signal. The voltage loop signal is obtained by causing an error amplifier 109 to amplify the difference between a reference voltage 107 and a voltage obtained by dividing the output voltage Vo of the DC-DC converter 218a by an output setting resistor 105.

A driving control unit 112 inputs the voltage loop signal and a clock signal generated by an oscillator (OSC) 103. The clock signal is used as a reference clock for controlling a duty in PWM. The driving control unit 112 includes the first driving signal output unit which outputs a driving signal (corresponding to a driving signal of a switch 102 (upper side switch)) for setting the switch 102 in an on-state or off-state. The driving control unit 112 also includes the second driving signal output unit which outputs a driving signal (corresponding to a driving signal of a switch 104 (lower side switch)) for setting the switch 104 in an on-state or off-state. Note that the driving signal output from the first driving signal output unit and that output from the second driving signal output unit may the same driving signal or different driving signals. The switch 102 is, for example, a first switching element comprising a p-type MOSFET (metal-oxide-semiconductor field-effect transistor). The switch 104 is, for example, a second switching element comprising an n-type MOSFET (metal-oxide-semiconductor field-effect transistor). In the first to third embodiments, a state in which the drain-to-source path of the MOSFET is conductive is set as the on-state, and a state in which the drain-to-source path of the MOSFET is non-conductive is set as the off-state. A diode 106 serves as a parasitic element when the switch 104 is a MOSFET, and also functions as a p-n junction rectifier diode.

The switch 102 has a source connected to the battery 219 and a drain connected to one end of an inductor 108 and the drain of the switch 104. The switch 104 has a source connected to ground. The connection destination of the source of the switch 102 is not limited to the battery 219, and may be a power source, for example, a power adapter or the like. Furthermore, the other end of the inductor 108 is connected to one end of a capacitor 110 and the output terminal of the DC-DC converter 218a.

A current flowing to the inductor 108 changes depending on the states of the switches 102 and 104. If the switch 102 is in the on-state and the switch 104 is in the off-state, a current flows from the battery 219 to the inductor 108, and exciting energy is accumulated in the inductor 108.

If the switch 102 is in the off-state and the switch 104 is in the off-state, a load current flows through a loop "inductor 108→load→ground→diode 106", and the exciting energy accumulated in the inductor 108 is released toward the load. If, for example, a forward voltage $V_F$ of the parasitic diode 106 is 0.6 V and the load current is 1 A, a loss of 0.6 W occurs in the parasitic diode 106.

If an on-resistance $Ron_{104}$ of the switch 104 is lower than $0.6/1=0.6\Omega$, it is possible to suppress a loss to a value smaller than 0.6 W by setting the switch 104 in the on-state, thereby reducing the loss. Therefore, if the switch 102 is in the off-state, the switch 104 is set in the on-state to cause the load current to flow through a loop "inductor 108→load-→ground→switch 104", thereby releasing the exciting energy accumulated in the inductor 108 toward the load.

The inductor 108 is called a "power inductor". The capacitor 110 arranged between the inductor 108 and the output terminal of the DC-DC converter 218a functions as a "smoothing capacitor" for smoothing the pulsating flows of a voltage and current caused by switching.

If the output voltage Vo decreases due to a load variation, the signal value of the voltage loop signal output from the error amplifier 109 becomes large, and the ratio (to be referred to as the on-duty hereinafter) of the switch 102 being set in the on-state becomes high, thereby performing feedback control in a direction in which the output voltage Vo increases. Conversely, if the output voltage Vo increases, the signal value of the voltage loop signal output from the error amplifier 109 becomes small, and the on-duty of the switch 102 becomes small, thereby performing feedback control in a direction in which the output voltage Vo decreases.

A current detection unit 118 is an instrumentation amplifier or the like for detecting a current flowing through the drain-to-source path of the switch 104. The current detection unit 118 outputs a current detection signal obtained by amplifying a voltage corresponding to the product ($Ron_{104}$× $Ids_{104}$) of the on-resistance $Ron_{104}$ of the switch 104 and a current $Ids_{104}$ flowing through the drain-to-source path of the switch 104. The current detection signal is input to an analog-to-digital converter (ADC) 111 in the driving control unit 112.

Figure 3:
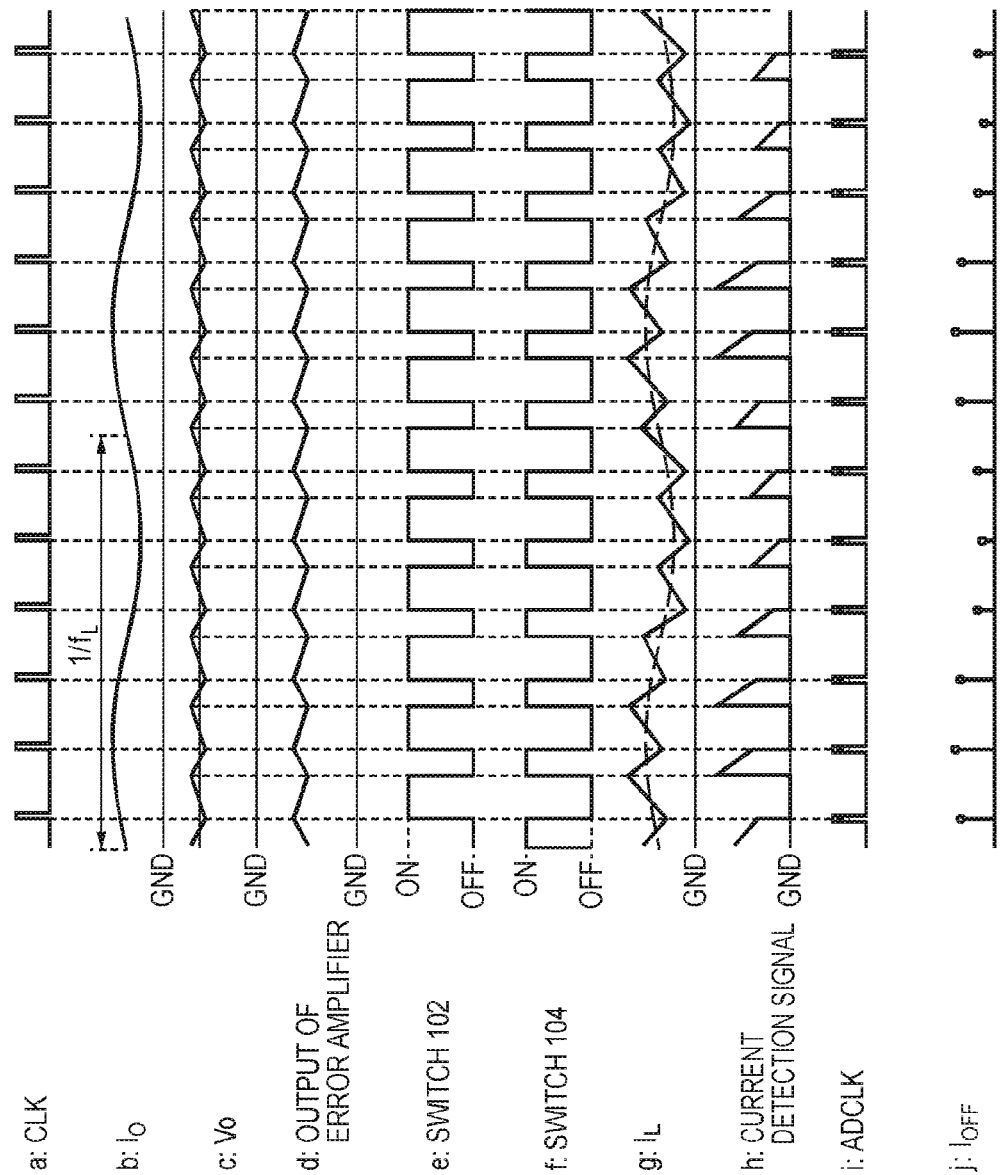

An operation of the DC-DC converter 218a will be described next with reference to FIG. 3. FIG. 3 shows voltage and current waveforms related to the DC-DC converter 218a.

A waveform (a) indicates a reference clock CLK. The driving control unit 112 controls the states of the switches 102 and 104 in synchronism with CLK. A waveform (b) indicates an output current (which corresponds to load current) Io of the DC-DC converter 218a. For the sake of simplicity, assume that a variation in load current Io indicates a sinusoidal wave of a frequency $f_L$.

A waveform (c) indicates the output voltage Vo of the DC-DC converter 218a. The output voltage Vo ideally has a constant value. In fact, however, a variation component which remains since the load variation (waveform (b)) cannot be followed, or a ripple voltage synchronized with switching exists in the output voltage Vo.

A waveform (d) indicates the voltage loop signal obtained by causing the error amplifier 109 to amplify the difference between the reference voltage 107 and the voltage obtained by dividing the output voltage Vo (waveform (c)). If the output voltage Vo (waveform (c)) is equal to a setting value, the value of the voltage loop signal (waveform (d)) is zero. In fact, however, there exists the above-described deviation (which is caused by variation component or ripple voltage), and thus a signal value is obtained by inverting and amplifying the deviation. Note that there exists an offset voltage in the voltage loop signal (waveform (d)) shown in FIG. 3 and thus the voltage changes by centering the offset voltage.

A waveform (e) indicates the on-state and off-state of the switch 102. A waveform (f) indicates the on-state and off-state of the switch 104. Referring to FIG. 3, the on-state is represented by high level, and the off-state is represented by low level. One cycle of the on-state and off-state always coincides with the cycle of CLK. If there is a period during which the switches 102 and 104 are set in the on-state at the same time, a state (to be referred to as a flow-through state hereinafter) in which a current flows from the battery 219 to ground occurs. To prevent the flow-through state, a period (to be referred to as a dead time hereinafter) for setting the switch 104 in the on-state after the switch 102 transits to the off-state and causing the switch 104 to transit to the off-state before the switch 102 is set in the on-state is provided in state control of the switch 104.

A waveform (g) indicates a current $I_L$ flowing to the inductor 108. If the switch 102 is set in the on-state, the current $I_L$ flows through a path "battery 219→switch 102→inductor 108", and energy is accumulated in the inductor 108. At this time, a slope $dI_L/dt_{ON}$ of the current $I_L$ is given by:

$$dI_L/dt_{ON}=(Vb-Vo)/L \qquad (1)$$

where Vb represents the voltage of the battery 219, Vo represents the output voltage, and L represents the inductance of the inductor 108.

During a short period of one cycle of CLK, under the normal condition, Vb, Vo, and L are almost constant, $dI_L/dt_{ON}$ is a fixed value, and the current $I_L$ linearly increases. At this time, the switch 104 is in the off-state so no short circuit (no flow-through state) occurs between ground and the positive electrode of the battery 219.

After that, if the switch 102 is set in the off-state, the energy accumulated in the inductor 108 causes the current $I_L$ to flow through a path "ground→switch 104→inductor 108". A slope $dI_L/dt_{OFF}$ of the current is given by:

$$dI_L/dt_{OFF}=-Vo/L \qquad (2)$$

Regardless of whether the current increases or decreases, $dI_L/dt_{OFF}$ is a fixed value, similarly to $dI_L/dt_{ON}$. In one cycle of the on-state and off-state, the current $I_L$ presents a continuous triangular current waveform, and the average value is equal to the load current Io (waveform (b)).

A waveform (h) indicates the current detection signal output from the current detection unit 118. As described above, the current detection signal has a waveform proportional to the product of the current $Ids_{104}$ flowing through the drain-to-source path of the switch 104 and the on-resistance $Ron_{104}$ of the switch 104. The current $Ids_{104}$ while the switch 104 is in the on-state is equal to the current $I_L$ (waveform (g)), and has a trapezoidal waveform whose slope at the fall is equal to $dI_L/dt_{OFF}$, as shown in FIG. 3. FIG. 3 assumes that the slope of the current $I_L$ is equal to that of the current detection signal, for the sake of easy understanding.

A waveform (i) indicates ADCLK as the sampling CLK of the ADC 111. A waveform (j) indicates a result of A/D-converting the current detection signal (waveform (h)) in response to ADCLK. The A/D conversion result is discretized in every cycle but digital data corresponding to the value of a current $I_{OFF}$ is obtained.

The timing at which the current detection signal is sampled will be described. In the following description, a current flowing through a loop "inductor 108→load-→ground→switch 104→inductor 108" while the switch 102 is in the off-state will be referred to as a "return current" hereinafter. The current $I_{OFF}$ corresponds to the return current which flows to the parasitic diode 106 after the switch 102 transits to the off-state and the switch 104 transits to the off-state. It is possible to acquire the value of the current $I_{OFF}$ by controlling ADCLK in synchronism with the timing at which the driving signal of the switch 104 changes from the on-state to the off-state.

Strictly, there are the operation delay time of the driving control unit 112 and the operation transition time from the fall of the driving signal (to be described later) until the switch 104 transits to the off-state and a current starts to flow to the parasitic diode 106. The difference in current flowing to the switch 104 before and after each of these times elapses is not a problem in the first embodiment, and is thus neglected.

Alternatively, a load current $Io_{50}$ at the midpoint (a timing of about $0.5 \times Ton_{104}$) of an on-period $Ton_{104}$ of the switch 104 may be detected, thereby acquiring the value of the current $I_{OFF}$ from calculation by a ripple current, given by:

$$I_{OFF} = Io_{50} - (Vb - Vo) \times Vo/(2f \times L \times Vb) \qquad (3)$$

where f represents the frequency of CLK.

Alternatively, the current detection unit 118 may be connected to the switch 102, a load current $Io_{50}$ at the midpoint (a timing of about $0.5 \times Ton_{102}$) of an on-period $Ton_{102}$ of the switch 102 may be detected, thereby calculating the value of the current $I_{OFF}$ by equation (3).

[Ringing Noise]

The ringing noise generated at the timing of switching of the DC-DC converter 218a will be described based on an operation during a switching transition period in which the switch 104 (lower side switch) is turned off.

Figure 4:
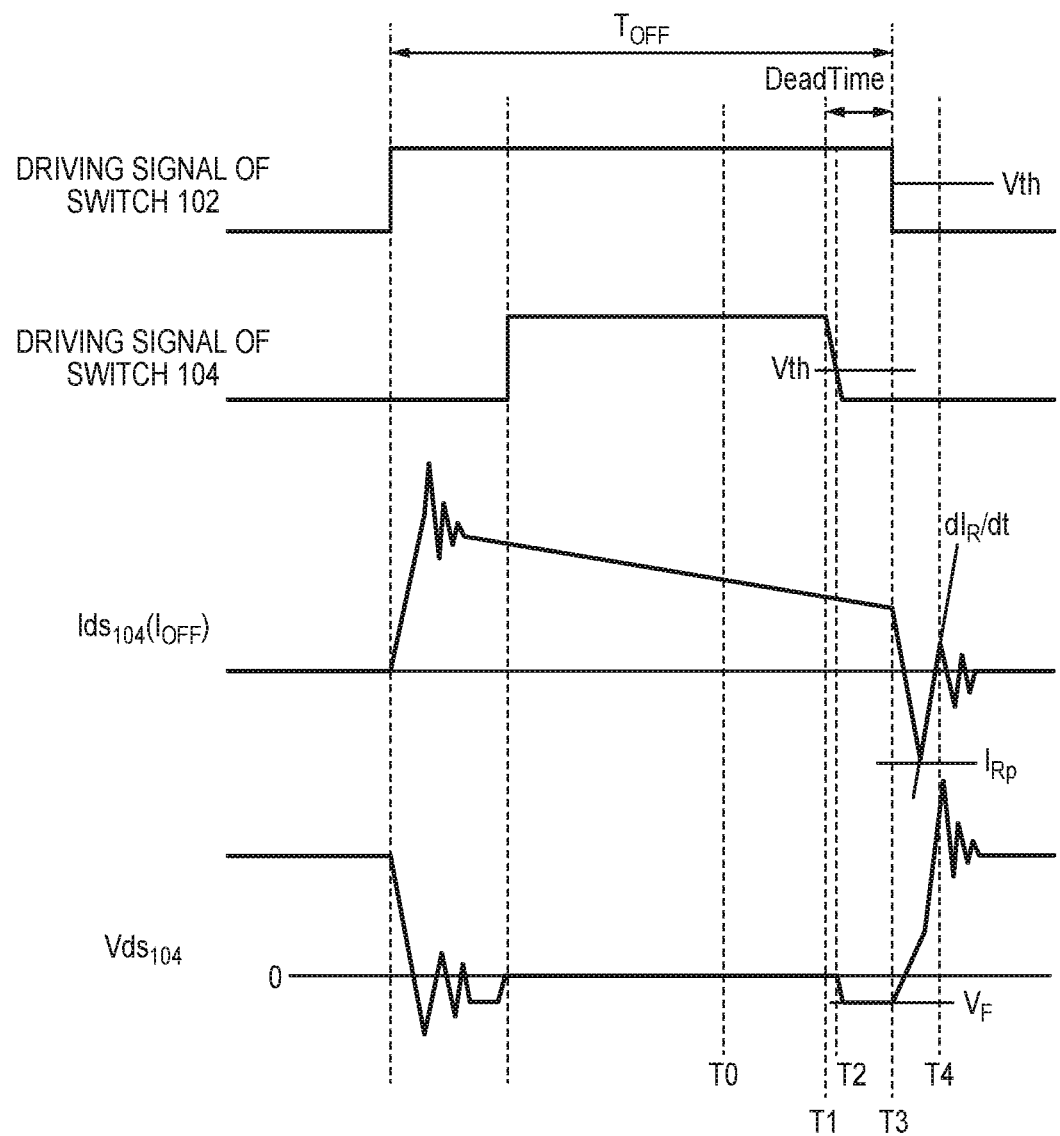
FIG. 4 is a timing chart illustrating an operation of a switch 104 (lower side switch)

An operation of the switch 104 (lower side switch) will be explained with reference to FIG. 4.

At timing T0, the switch 102 is in the off-state, the switch 104 is in the on-state, and the exciting energy accumulated in the inductor 108 is being released.

At timing T1, the driving control unit 112 switches the driving signal of the switch 104 from H level to L level (to be referred to as H→L hereinafter) to turn off the switch 104. Even if the driving signal is switched from H level to L level, the switch 104 is never set in the off-state before a gate voltage Vgs of the switch 104 becomes lower than a gate threshold voltage Vth, and thus the current $Ids_{104}$ flows.

At timing T2, if Vgs<Vth is satisfied, the switch 104 is set in the off-state, and the return current flows to the parasitic diode 106. Alternatively, a decrease in the gate voltage Vgs increases the on-resistance $Ron_{104}$ of the switch 104, and if a drain-source voltage $Vds_{104}$ ($=Ron_{104} \times Ids_{104}$) reaches the forward voltage $V_F$ of the parasitic diode 106, the return current flows to the parasitic diode 106.

At timing T3, if the dead time (DeadTime) as the period for preventing the above-described flow-through state ends, the driving control unit 112 switches the driving signal of the switch 102 from H level to L level to turn on the switch 102. At this timing, a current starts to flow from the battery 219 through the switch 102, and then flows into the parasitic diode 106 so as to cancel the return current flowing to the parasitic diode 106.

Even if a return current flowing to the parasitic diode 106 becomes zero, a recovery current $I_R$ flows to the parasitic diode 106 in the reverse direction due to the recovery characteristic of the parasitic diode 106 until carriers corresponding to the value of the current $I_{OFF}$ in the forward direction disappear. The recovery current $I_R$ is a short circuit current flowing through a loop "parasitic diode 106→ground→battery 219→switch 102→parasitic diode 106", and the energy of the recovery current $I_R$ is accumulated in the inductance parasitic to the wiring of the loop. Energy U accumulated by the recovery current $I_R$ is given by:

$$U = (1/2) \times L_p \times I_{Rp}^2 \qquad (4)$$

where $L_p$ represents the total of the parasitic inductance existing in the loop, and $I_{Rp}$ represents the peak current of the recovery current $I_R$.

The energy U is released after the recovery time of the parasitic diode 106 but LC resonance of the stray capacitance and the parasitic inductance existing in the loop occurs along with an abrupt change $dI_R/dt$ in the recovery current $I_R$. As a result, high-frequency ringing noise is superimposed on the drain-source voltage $Vds_{104}$ of the switch 104. A frequency $f_R$ of the ringing noise is given by:

$$f_R = 1/\{2\pi \sqrt{(L_p \times C_p)}\} \qquad (5)$$

where $C_p$ represents the total of the stray capacitance existing in the loop.

[Reduction in Ringing Noise]

To reduce the ringing noise, it is necessary to decrease the energy U accumulated in a parasitic inductance $L_p$. To do this, it is effective to suppress the peak current $I_{Rp}$ of the recovery current $I_R$ which flows to cause the carriers of the parasitic diode 106 to disappear. The recovery current $I_R$ flows through the loop "parasitic diode 106→ground→battery 219→switch 102→parasitic diode 106". In this loop, a controllable element is the on-resistance $Ron_{102}$ of the switch 102, and it is possible to suppress the peak current $I_{Rp}$ of the recovery current $I_R$ by increasing the on-resistance $Ron_{102}$.

During a period (to be referred to as a turn-on period hereinafter) in which the switch 102 is made to transit from the off-state to the on-state, control is performed to gradually decrease the on-resistance $Ron_{102}$. The switch 102 as a p-type MOSFET has a characteristic in which the switch 102 is set in the on-state when the gate voltage is equal to or lower than the gate threshold voltage (Vgs≤Vth) and the on-resistance $Ron_{102}$ decreases along with a decrease in the gate voltage Vgs. Therefore, by performing control to prolong the fall time (to be referred to as OnSlewRateTime hereinafter) of the gate voltage Vgs of the switch 102, it is possible to gradually decrease the on-resistance $Ron_{102}$.

To prolong OnSlewRateTime, for example, a resistor 113 is added between the output terminal of the driving signal of the driving control unit 112 and the gate of the switch 102. The resistor 113 forms an RC filter together with the input capacitor of the gate corresponding to the parasitic capacitance of the switch 102.

Operations of the switch 102 (upper side switch) and the switch 104 (lower side switch) when OnSlewRateTime is prolonged by the RC filter will be described with reference to FIG. 5A. As shown in FIG. 5A, an increase in the on-resistance $Ron_{102}$ decreases the peak current $I_{Rp}$ of the recovery current $I_R$, thereby suppressing the ringing noise.

To prolong OnSlewRateTime, a method of changing stepwise the voltage level of the driving signal output from the driving control unit 112 may be used. FIG. 5B is another timing chart illustrating operations of the switches 102 and 104 when OnSlewRateTime is prolonged by changing the gate voltage of the switch 102 stepwise. As shown in FIG. 5B, an increase in the on-resistance $Ron_{102}$ decreases the peak current $I_{Rp}$ of the recovery current $I_R$, thereby suppressing the ringing noise. These methods are examples for prolonging OnSlewRateTime, and any methods such as pulse amplitude modulation (PAM) control can be adopted as a method of prolonging OnSlewRateTime.

By increasing the on-resistance $Ron_{102}$ of the switch 102 during the turn-on period, the peak current $I_{Rp}$ of the recovery current $I_R$ is suppressed, and the energy U accumulated in the parasitic inductance $L_p$ decreases, thereby reducing the ringing noise. However, if the on-resistance Ron$_{102}$ is kept high even after the carriers of the parasitic diode 106 disappear, the transition loss occurring at the time of switching increases. The carriers of the parasitic diode 106 depend on the value of the current I$_{OFF}$ in the forward direction, and a recovery time changes accordingly. Furthermore, the value of the current I$_{OFF}$ depends on the load. Therefore, by increasing the on-resistance Ron$_{102}$, it is possible to suppress the ringing noise generated at the time of switching, and suppress the transition loss occurring at the time of switching after recovery. The load state of the power supply device 218 changes appropriate OnSlewRateTime.

An example of an OnSlewRateTime table will be described next with reference to FIG. 6A. A driving mode in the OnSlewRateTime table corresponds to a range of a signal value (the digital value of the current detection signal to be referred to as a detected current hereinafter) output from the ADC 111, and ranges corresponding to respective driving modes are different. For example, driving mode 1 corresponds to a detected current of 0≤I$_{OFF}$<0.1 A, driving mode 2 corresponds to a detected current of 0.1 A≤I$_{OFF}$<0.2 A, . . . , and driving mode 5 corresponds to a detected current of 1.0 A≤I$_{OFF}$<2.0 A. Note that the values of OnSlewRateTime shown in FIG. 6A are merely examples.

Components of the first driving signal output unit as part of the driving control unit 112 will be described next with reference to FIG. 6B. The first driving signal output unit is configured to output a driving signal to the switch 102. If the above-described RC filter is used, the first driving signal output unit includes resistors R121 to R125 each for implementing OnSlewRateTime corresponding to each driving mode, and a selector 126 for selecting one of the resistors R121 to R125. The driving control unit 112 can cause the selector 126 to select a resistor for implementing appropriate OnSlewRateTime by supplying, to the selector 126, a selection signal corresponding to a detected current, thereby controlling turn-on of the switch 102.

Figures 6A, 6B:
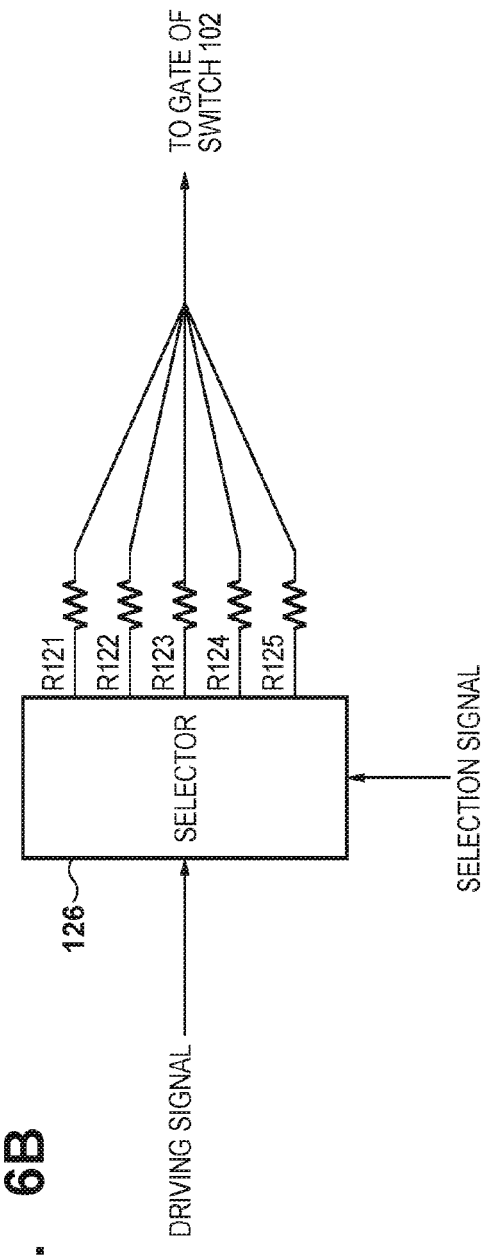
FIG. 6A is a table showing an example of an OnSlewRateTime table.
FIG. 6B is a diagram illustrating components of a first driving signal output unit included in a driving control unit 112.

For the sake of simplicity, FIG. 6B shows the resistors R121 to R125 corresponding to driving modes 1 to 5 and, for example, the resistor R121 corresponding to driving mode 1 may have 0Ω. Furthermore, a relationship of the resistors R121 to R125 respectively corresponding to driving modes 1 to 5 have is R121<R122<R123<R124<R125. That is, the driving control unit 112 supplies the driving signal to the gate of the switch 102 via the resistor selected by the selector 126.

According to the OnSlewRateTime table shown in FIG. 6A, if the detected current corresponds to the range of driving mode 1, "+0 nsec" is set as OnSlewRateTime, and control is performed to prioritize a decrease in transition loss over ringing noise suppression. On the other hand, if the detected current corresponds to the range of driving mode 5, "+20 nsec" is set as OnSlewRateTime, and control is performed to prioritize ringing noise suppression by low-speed switching whose OnSlewRateTime is longer by 20 nsec.

In the OnSlewRateTime table, OnSlewRateTime is set in consideration of the recovery time of the parasitic diode 106 at the load current Io corresponding to each of driving modes 1 to 5. Thus, after the end of recovery, the on-resistance Ron$_{102}$ of the switch 102 is controlled to be sufficiently low, and the transition loss occurring at the time of switching never increases unnecessarily.

An example in which the ADC 111 converts the current detection signal output from the current detection unit 118 into a detected current and OnSlewRateTime is set based on the detected current has been described above. A method of comparing the current detection signal with thresholds using a comparator without using the ADC 111, and setting OnSlewRateTime (e.g., selecting a resistor) based on the comparison result can be adopted. An example in which a current detection signal is generated for every switching period and OnSlewRateTime is selected has been explained. However, the current detection signals (or detected currents) may be averaged during a period longer than the switching period, and then OnSlewRateTime may be set based on the average value.

As described above, in accordance with the load state of the power supply device 218, the electronic device 200 according to the first embodiment can flexibly switch whether to prioritize a reduction in ringing noise generated at the time of switching or a reduction in transition loss occurring at the time switching. This allows the electronic device 200 to reduce the ringing noise or transition loss occurring at the time of switching.

Second Embodiment

An electronic device 200 and a control method therefor according to the second embodiment will be described below. Note that in the second embodiment, the same reference numerals as in the first embodiment denote the same components and a description thereof may be omitted.

A recovery current I$_R$ of a parasitic diode 106 is generated when a return current flows to the parasitic diode 106. If the on-state of a switch 104 is maintained up to the time immediately before a switch 102 is turned on, and the switch 104 can be turned off simultaneously with turn-on of the switch 102, no return current flows to the parasitic diode 106. As a result, it is possible to prevent ringing noise from being generated due to the recovery current I$_R$ of the parasitic diode 106. However, as described above, if the switches 102 and 104 are set in the on-state at the same time, a flow-through state occurs, and thus a dead time for turning off the switch 104 before the switch 102 is turned on is provided.

For example, a gate voltage Vgs of the switch 104 is gradually decreased during the dead time, and the gate voltage Vgs of the switch 104 is decreased to a gate threshold voltage Vth when the switch 102 is turned on. By performing such ideal control, a current Ids$_{104}$ continuously flows to the channel of the switch 104 during the dead time, and no return current flows to the parasitic diode 106.

If a decrease in the gate voltage Vgs increases an on-resistance Ron$_{104}$ of the switch 104, a drain-source voltage Vds$_{104}$ (=Ron$_{104}$×Ids$_{104}$) of the switch 104 increases. When Vds$_{104}$ reaches a forward voltage V$_F$ of the parasitic diode 106, part of the return current starts to flow to the parasitic diode 106. In this case, since the return current flows to both the channel of the switch 104 and the parasitic diode 106, a current flowing to the parasitic diode 106 is small, as compared with a case in which the switch 104 is in the off-state. Therefore, although the recovery current I$_R$ is generated, a peak current I$_{Rp}$ of the recovery current I$_R$ becomes small, as compared with a case in which all of the return current flows to the parasitic diode 106.

If a condition that the gate voltage of the switch 104 is lower than the gate threshold voltage (Vgs<Vth) is not satisfied immediately after the switch 102 is turned on, the switch 104 is in the on-state, a flow-through state occurs, and a current flows from a battery 219 to ground. Even if, however, a flow-through state occurs, the on-resistance Ron$_{104}$ of the switch 104 increases under the above control, and thus the current flowing from the battery 219 to ground becomes small, as compared with a case in which the switch 104 is in the normal on-state and Ron$_{104}$ is very low.

In the second embodiment, control is performed to gradually increase the on-resistance $Ron_{104}$ during a period (to be referred to as a turn-off period hereinafter) in which the switch 104 is made to transit from the on-state to the off-state. The switch 104 as an n-type MOSFET has a characteristic in which the on-resistance $Ron_{104}$ increases along with a decrease in the gate voltage Vgs and the switch 104 is set in the off-state when the gate voltage is equal to or lower than the gate threshold voltage (Vgs≤Vth). Therefore, by performing control to prolong the fall time (to be referred to as OffSlewRateTime hereinafter) of the gate voltage Vgs of the switch 104, it is possible to gradually increase the on-resistance $Ron_{104}$.

To prolong OffSlewRateTime, for example, a resistor is added between the output terminal of the driving signal of a driving control unit 112 and the gate of the switch 104. This resistor forms an RC filter together with the input capacitor of the gate corresponding to the parasitic capacitance of the switch 104.

Operations of the switch 102 (upper side switch) and the switch 104 (lower side switch) when OffSlewRateTime is prolonged by the RC filter will be described with reference to FIG. 7A. FIG. 7A shows a state in which the above-described ideal control decreases the gate voltage Vgs of the switch 104 to the gate threshold voltage Vth when the switch 102 is turned on.

As shown in FIG. 7A, when OffSlewRateTime increases, the gate voltage Vgs of the switch 104 gradually decreases during a dead time period (T1 to T3), and reaches the gate threshold voltage Vth at the end T3 of the dead time period. Therefore, there is no period (T2 to T3) during which the return current flows to the parasitic diode 106. Note that as indicated by a broken line during the dead time period (T1 to T3) in FIG. 7A, when $Vds_{104}$ reaches $V_F$, part of the return current flows to the parasitic diode 106.

Carriers existing in the channel of the switch 104 and charges accumulated in the parasitic capacitance of the switch 104 leave a current flowing in the reverse direction like the recovery current $I_R$ after the switch 102 is turned on. However, since there is no (or small) recovery current $I_R$ caused by the accumulated carriers of the parasitic diode 106, the peak of the current flowing in the reverse direction becomes small, thereby reducing the ringing noise.

To prolong OffSlewRateTime, a method of changing stepwise the voltage level of the driving signal output from the driving control unit 112 may be used. FIG. 7B is another timing chart illustrating operations of the switches 102 and 104 when OffSlewRateTime is prolonged by changing the gate voltage Vgs of the switch 104 stepwise. FIG. 7B shows a state in which the above-described ideal control decreases the gate voltage Vgs of the switch 104 to the gate threshold voltage Vth when the switch 102 is turned on.

As shown in FIG. 7B, when OffSlewRateTime increases, the gate voltage Vgs of the switch 104 decreases stepwise during the dead time period (T1 to T3), and reaches the gate threshold voltage Vth at the end T3 of the dead time period. Therefore, similarly to the case shown in FIG. 7A, there is no period (T2 to T3) during which the return current flows to the parasitic diode 106. Note that as indicated by a broken line during the dead time period (T1 to T3) in FIG. 7B, when $Vds_{104}$ reaches $V_F$, part of the return current flows to the parasitic diode 106. Therefore, since there is no (or small) recovery current $I_R$ caused by the accumulated carriers of the parasitic diode 106, the peak of the current flowing in the reverse direction becomes small, thereby reducing the ringing noise.

If the on-state of the switch 104 continues for a long time during the turn-off period, the switch 102 is turned on during this time to cause a flow-through state. Even though $Ron_{104}$ is high, a current flows from the battery 219 to ground to increase the transition loss occurring at the time of switching. In other words, appropriate OffSlewRateTime which suppresses the ringing noise by prolonging the period of the on-state of the switch 104 during the turn-off period and prevents a transition loss from occurring at the time of switching due to a flow-through state changes depending on the load state of a power supply device 218, similarly to the first embodiment.

An example of an OffSlewRateTime table will be described with reference to FIG. 8A. A driving mode in the OffSlewRateTime table corresponds to a range of a detected current output from an ADC 111, and ranges corresponding to respective driving modes are different. For example, driving mode 1 corresponds to a detected current of $0 \leq I_{OFF} < 0.1$ A, driving mode 2 corresponds to a detected current of $0.1$ A $\leq I_{OFF} < 0.2$ A, . . . , and driving mode 5 corresponds to a detected current of $1.0$ A $\leq I_{OFF} < 2.0$ A. Note that the values of OffSlewRateTime shown in FIG. 8A are merely examples.

Components of the second driving signal output unit as part of the driving control unit 112 will be described with reference to FIG. 8B. The second driving signal output unit is configured to output a driving signal to the switch 104. If the above-described RC filter is used, the second driving signal output unit includes resistors R131 to R135 each for implementing OffSlewRateTime corresponding to each driving mode, and a selector 136 for selecting one of the resistors R131 to R135. The driving control unit 112 can cause the selector 136 to select a resistor for implementing appropriate OffSlewRateTime by supplying, to the selector 136, a selection signal corresponding to a detected current, thereby controlling turn-off of the switch 104.

Figures 8A, 8B:
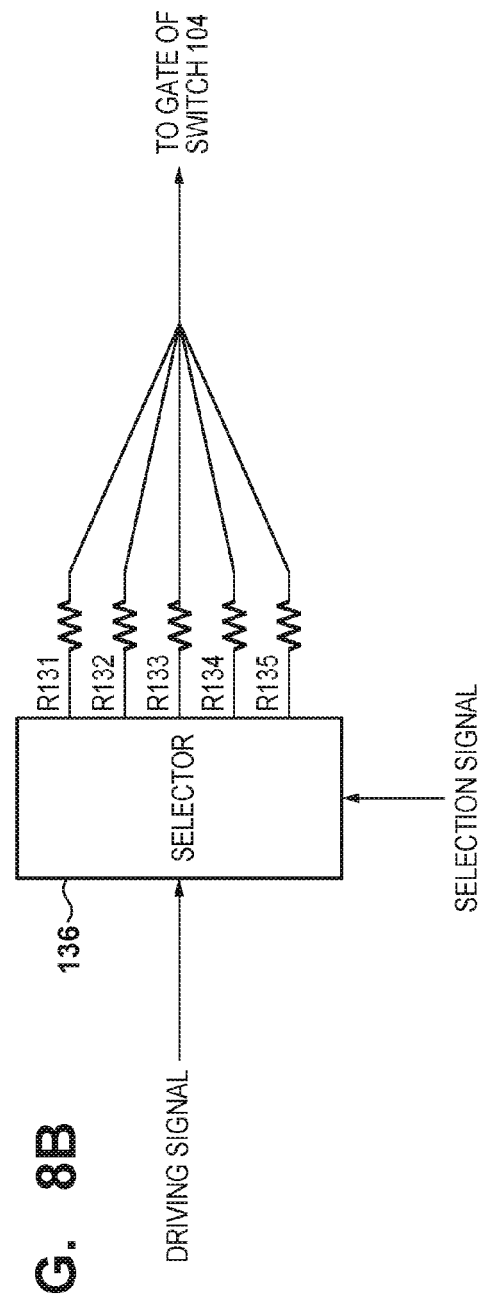
FIG. 8A is a table showing an example of an OffSlewRateTime table.
FIG. 8B is a diagram illustrating components of a second driving signal output unit included in the driving control unit 112.

For the sake of simplicity, FIG. 8B shows the resistors R131 to R135 corresponding to driving modes 1 to 5 and, for example, the resistor R131 corresponding to driving mode 1 may be 0Ω. Furthermore, a relationship of the resistors R131 to R135 respectively corresponding to driving modes 1 to 5 is R131<R132<R133<R134<R135. That is, the driving control unit 112 supplies the driving signal to the gate of the switch 104 via the resistor selected by the selector 136.

According to the OffSlewRateTime table shown in FIG. 8A, if the detected current corresponds to the range of driving mode 1, "+0 nsec" is set as OffSlewRateTime, and control is performed to prioritize a decrease in transition loss over ringing noise suppression. On the other hand, if the detected current corresponds to the range of driving mode 5, "+20 nsec" is set as OffSlewRateTime, and control is performed to prioritize ringing noise suppression by low-speed switching whose OffSlewRateTime is longer by 20 nsec.

Note that in the OffSlewRateTime table, OffSlewRateTime is set in consideration of a dead time in a load current Io corresponding to each of driving modes 1 to 5, thereby suppressing the occurrence of a flow-through state as much as possible.

Similarly to the first embodiment, a method of comparing the current detection signal with thresholds using a comparator without using the ADC 111 for obtaining a detected current, and setting OffSlewRateTime (e.g., selecting a resistor) based on the comparison result can be adopted. The current detection signals (or detected currents) may be averaged during a period longer than the switching period, and then OffSlewRateTime may be set based on the average value.

According to the second embodiment, in ideal control, no return current flows to the parasitic diode 106, no ringing noise caused by the recovery current $I_R$ is generated, and no flow-through state occurs. If the control deviates from the ideal control, the following situation occurs.

If the gate voltage Vgs of the switch 104 does not decrease to the gate threshold voltage Vth after the switch 102 is turned on, a flow-through state occurs, and a current flows from the battery 219 to ground. Since, however, $Ron_{104}$ is high and the occurrence period of the flow-through state is short, a loss is suppressed to be relatively small. In this case, no ringing noise caused by the recovery current $I_R$ is generated.

If $Ron_{104} \times Ids_{104}$ reaches $V_F$ and part of the return current flows to the parasitic diode 106, the current flowing to the parasitic diode 106 is small, as compared with a case in which the switch 104 is in the off-state, thereby suppressing the ringing noise caused by the recovery current $I_R$.

As described above, in accordance with the load state of the power supply device 218, the electronic device 200 according to the second embodiment can flexibly switch whether to prioritize a reduction in ringing noise generated at the time of switching or a reduction in transition loss occurring at the time switching. This allows the electronic device 200 to reduce the ringing noise generated or transition loss occurring at the time of switching.

Third Embodiment

An electronic device 200 and a control method therefor according to the third embodiment will be described below. Note that in the third embodiment, the same reference numerals as in the first and second embodiments denote the same components and a description thereof may be omitted.

The third embodiment in which the control according to the first embodiment and that according to the second embodiment are combined will be described below. In other words, control of a peak current $I_{Rp}$ of a recovery current $I_R$ and control of a return current flowing to a parasitic diode 106 are combined to reduce ringing noise.

FIG. 9 shows an example of SlewRateTime table. A driving mode in the SlewRateTime table corresponds to a range of a detected current output from an ADC 111, and ranges corresponding to respective driving modes are different. For example, driving mode 1 corresponds to a detected current of $0 \leq I_{OFF} < 0.1$ A, driving mode 2 corresponds to a detected current of $0.1$ A $\leq I_{OFF} < 0.2$ A, . . . , and driving mode 5 corresponds to a detected current of $1.0$ A $\leq I_{OFF} < 2.0$ A. Note that the values of OnSlewRateTime and the values of OffSlewRateTime shown in FIG. 9 are merely examples.

According to the SlewRateTime table shown in FIG. 9, if a detected current corresponds to the range of driving mode 1, "+0 nsec" is set as OnSlewRateTime and OffSlewRateTime. That is, control is performed to prioritize a decrease in transition loss over ringing noise suppression. On the other hand, if the detected current corresponds to the range of driving mode 5, "+8 nsec" is set as OnSlewRateTime and "+20 nsec" is set as OffSlewRateTime. Control is performed to prioritize ringing noise suppression by low-speed switching whose OnSlewRateTime is longer by 8 nsec and whose OffSlewRateTime is longer by 20 nsec.

The values of OnSlewRateTime in the SlewRateTime table shown in FIG. 9 are respectively smaller than those of OnSlewRateTime in the OnSlewRateTime table shown in FIG. 6A. This is because an increase in OffSlewRateTime shortens the recovery time and the value of OnSlewRateTime can be decreased accordingly. A period during which an on-resistance $Ron_{102}$ of a switch 102 is high is shortened by a change in the value of OnSlewRateTime, thereby reducing the transition loss occurring at the time of switching.

A driving control unit 112 may use a SlewRateTime table corresponding to the input voltage or the operation mode of the electronic device 200, and the setting values of OnSlewRateTime and OffSlewRateTime are not limited to those in FIGS. 6A, 8A, and 9.

Figure 10:
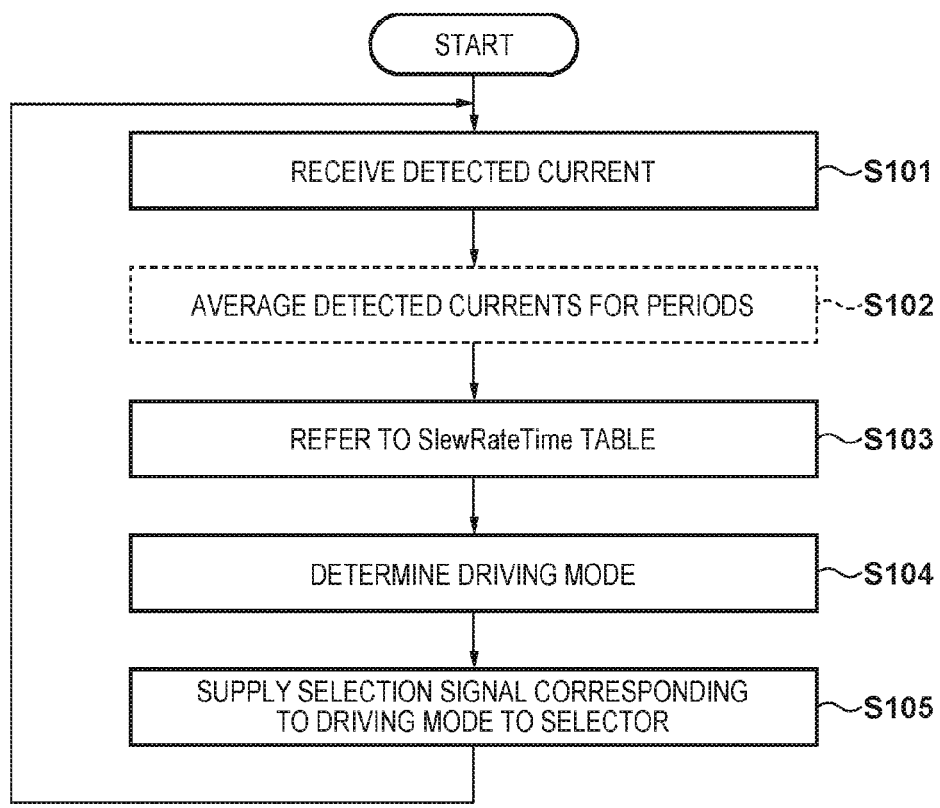
FIG. 10 is a flowchart illustrating an operation of the driving control unit 112.

Driving control by the driving control unit 112 will be described with reference to a flowchart shown in FIG. 10. Note that the driving control shown in FIG. 10 is common to the first to third embodiments.

The driving control unit 112 receives a detected current from the ADC 111 (step S101), refers to the SlewRateTime table (step S103), and determines a driving mode (step S104). Then, the driving control unit 112 supplies a selection signal corresponding to the driving mode to one or both of selectors 126 and 136 (step S105), and the process returns to step S101.

The operations in steps S101 to S105 are repeated in synchronism with a switching period but may be repeated at a period (e.g., two periods, three periods, . . . ) longer than the switching period, as described above. In this case, an operation of averaging detected currents for periods (step S102) is added between steps S101 and S103.

As described above, in accordance with the load state of a power supply device 218, the electronic device 200 according to the third embodiment can flexibly switch whether to prioritize a reduction in ringing noise generated at the time of switching or a reduction in transition loss occurring at the time switching. This allows the electronic device 200 to reduce the ringing noise or transition loss occurring at the time of switching.

Fourth Embodiment

An electronic device 200 and a control method therefor according to the fourth embodiment will be described below. Note that in the fourth embodiment, the same reference numerals as in the first to third embodiments denote the same components and a description thereof may be omitted.

An overview of the operation of the electronic device 200 and a method of selecting a driving mode in a SlewRateTime table based on the operation mode of the electronic device 200 will be described below. In the electronic device 200, when the user operates the power-on button of an instruction input unit 202, the instruction input unit 202 notifies a control unit 201 of an activation instruction. Upon receiving the activation instruction, the control unit 201 controls a power supply device 218 to start power supply to all the components of the electronic device 200.

If power is supplied, the control unit 201 confirms an operation mode set by the mode selection switch of the instruction input unit 202 based on a signal from the instruction input unit 202. The user can operate the mode selection switch to switch the operation mode of the electronic device 200 to, for example, a "still image capture mode", "moving image capture mode", or "reproduction mode".

In the "still image capture mode", the electronic device 200 is in an image capture standby state. If the user operates the still image recording button of the instruction input unit 202, the electronic device 200 starts to capture a still image, records a still image file in a storage device 213, and then returns to the capture standby state.

In the "moving image capture mode", the electronic device 200 is in the image capture standby state. If the user operates the moving image recording start button of the instruction input unit 202, the electronic device 200 starts to capture a moving image, and records moving image data and audio data in the storage device 213. After that, if the user operates the moving image recording end button of the instruction input unit 202, the electronic device 200 ends capturing of the moving image, stores, in a moving image file, the moving image data and audio data recorded in the storage device 213, and then returns to the image capture standby state.

In the "reproduction mode", the electronic device 200 reproduces the still image file or moving image file which has been stored in the storage device 213 and designated by the user. The load state of the power supply device 218 will be described by exemplifying the operation in the "still image capture mode".

In the "still image capture mode", an image capture unit 208 stores obtained image data in a memory 204. The control unit 201 controls a display control unit 210 to display, on a display unit 211, an image (through image) represented by the image data stored in the memory 204.

If a still image capture instruction is input, the control unit 201 controls the image capture unit 208 and a lens control unit 214 to execute image capturing. The image capture unit 208 stores, in the memory 204, image data obtained by image capturing. The control unit 201 controls the image processing unit 205 to perform the above-described development process and image quality adjustment process for the image data stored in the memory 204, supplies the processed image data to the display control unit 210, and displays a captured image on the display unit 211.

This generally corresponds to so-called "rec review" display in which the captured image is displayed on the display unit 211 immediately after the image is captured by a digital camera. A period from the still image capture instruction is input until the process of the image processing unit 205 ends, no image is displayed on the display unit 211, and a black image is displayed. A state such as "process is in progress" may be displayed instead of the black image.

Furthermore, the control unit 201 controls the image processing unit 205 to perform a coding process and the like for the image data having undergone the development process and image quality adjustment process. The control unit 201 determines whether the coding process has ended. If the control unit 201 determines that the coding process has ended, it supplies a generated still image file to a storage control unit 212 to store it in the storage device 213. After that, the image capture unit 208 stores image data, and the display control unit 210 displays a through image.

As described above, even in the "still image capture mode", blocks to be driven change with respect to time, and the load of the power supply device 218 accordingly changes. For example, in the image capture standby state in which image data acquired for a through image is temporarily stored in the memory 204 and the through image is displayed, the load of the power supply device 218 is relatively light and, for example, the input power of the power supply device 218 is 1.5 W.

On the other hand, at the time of still image capturing, the image capture unit 208 acquires image data, the lens control unit 214 controls exposure, focusing, and a shutter, the image processing unit 205 executes a development process, an image quality adjustment process, a coding process, and the like, and the storage control unit 212 records a still image file. Therefore, blocks are driven at the same time, and thus the load of the power supply device 218 is relatively heavy. For example, the input power of the power supply device 218 temporarily becomes 2.5 W. (In general, an image data amount at the time of image capturing is larger than an image data amount for a through image.)

Since neither the image capture unit 208 nor the lens control unit 214 is driven in a still image reproduction state, the load of the power supply device 218 is light and, for example, the input power of the power supply device 218 is 0.8 W. Furthermore, in a power saving mode in which the electronic device 200 is in an activation standby state, the storage control unit 212 is not driven either, and the control unit 201 is in a standby state. Thus, the load of the power supply device 218 is lightest and, for example, the input power of the power supply device 218 is 0.1 W.

Each of driving modes 1 to 5 described above is set in accordance with the current $I_{OFF}$ flowing for every switching period. The load also changes depending on the operation mode of the electronic device 200, and there is a correlation between the threshold of the driving mode and the operation mode of the electronic device 200. For example, the following correspondences between the driving modes and the operation modes are possible.

Driving mode 1: power saving mode
Driving mode 2: still image reproduction mode
Driving mode 3: moving image reproduction mode
Driving mode 4: image capture standby state in still image capture mode or moving image capture mode
Driving mode 5: at the time of image capturing in still image capture mode or moving image capture mode If the electronic device 200 is in the power saving mode or still image reproduction mode, the load is light, and the return current is small. In this case, even if the return current flows to a parasitic diode 106, a peak current $I_{Rp}$ of a recovery current $I_R$ is small, energy U accumulated in the parasitic inductance of a wiring loop is small, and ringing noise is small.

On the other hand, when the electronic device 200 captures an image in the still image capture mode or moving image capture mode, the load is heavy and the return current is large. In this case, if the return current flows to the parasitic diode 106, the peak current $I_{Rp}$ of the recovery current $I_R$ is large, the energy U accumulated in the parasitic inductance of the wiring loop is large, and ringing noise is large.

The control unit 201 sends an instruction of a driving mode corresponding to the operation mode of the electronic device 200 to a driving control unit 112. Upon receiving this instruction, the driving control unit 112 performs control to prolong one or both of OnSlewRateTime of a switch 102 and OffSlewRateTime of a switch 104 as the load in the operation mode is heavier. Therefore, in the operation mode in which the load is light, control is performed to prioritize a reduction in transition loss occurring at the time of switching by allowing ringing noise. In the operation mode in which the load is heavy, control is performed to prioritize a reduction in ringing noise by allowing a transition loss occurring at the time of switching. This allows the electronic device 200 according to the fourth embodiment to reduce the ringing noise or transition loss occurring at the time of switching.

Note that the control may be changed in accordance with a condition other than the magnitude of the load. For example, if the electronic device 200 is in the still image capture mode, it is possible to perform control to prioritize a reduction in transition loss occurring at the time of switching regardless of the magnitude of the load as long as the influence of the ringing noise falls within an allowable range. Thus, it is possible to reduce the energy consumption of a battery 219, thereby prolonging the life of the battery 219.

Furthermore, even if the electronic device 200 is in the still image capture mode, if the influence of the ringing noise caused by the load which has temporarily become large cannot be allowed, control may be performed to prioritize a reduction in ringing noise. In this case, it is possible to reduce noise radiated from the housing of the electronic device 200 into space.

While aspects of the present invention are described with reference to exemplary embodiments, it is to be understood that the aspects of the present invention are not limited to the exemplary embodiments. The scope of the following claims is to be accorded the broadest interpretation so as to encompass all modifications and equivalent structures.

This application claims priority from Japanese Patent Application No. 2015-224230, filed Nov. 16, 2015, which is hereby incorporated by reference herein in its entirety.

What is claimed is:

1. An electronic device comprising:
a first switching element connected between a power source and one end of a power inductor;
a second switching element connected between the one end of the power inductor and ground;
a detection unit that detects a current flowing to the second switching element and generates a current detection signal from the detected current; and
a control unit that gradually decreases an on-resistance of the first switching element when the first switching element is changed from an off-state to an on-state,
wherein the control unit controls a fall time of a gate voltage of the first switching element when the control unit gradually decreases the on-resistance of the first switching element,
wherein the control unit determines a driving mode corresponding to the fall time of the gate voltage of the first switching element, based on the current detection signal generated by the detection unit,
wherein the control unit causes a selector to select a resistor corresponding to the driving mode from among resistors,
wherein the control unit supplies a driving signal to a gate of the first switching element via the resistor selected by the selector, and
wherein the control unit includes the selector and the resistors.

2. The electronic device according to claim 1, wherein when the first switching element is in the off-state and the second switching element is in an off-state, a load current flows through a loop of the power inductor, a load of the electronic device, ground, and a parasitic diode of the second switching element.

3. A method performed in an electronic device including a first switching element connected between a power source and one end of a power inductor, and a second switching element connected between the one end of the power inductor and ground, the method comprising:
causing a detection unit to detect a current flowing to the second switching element and to generate a current detection signal from the detected current;
causing a control unit to gradually decrease an on-resistance of the first switching element when the first switching element is changed from an off-state to an on-state;
causing the control unit to control a fall time of a gate voltage of the first switching element when the control unit gradually decreases the on-resistance of the first switching element;
causing the control unit to determine a driving mode corresponding to the fall time of the gate voltage of the first switching element, based on the current detection signal generated by the detection unit;
causing a selector to select a resistor corresponding to the driving mode from among resistors; and
causing the control unit to supply a driving signal to a gate of the first switching element via the resistor selected by the selector,
wherein the electronic device includes the detection unit and the control unit, and the control unit includes the selector and the resistors.

4. The method according to claim 3, wherein when the first switching element is in the off-state and the second switching element is in an off-state, a load current flows through a loop of the power inductor, a load of the electronic device, ground, and a parasitic diode of the second switching element.

5. The electronic device according to claim 1, wherein the first switching element includes a p-type MOSFET, and the second switching element includes a n-type MOSFET.

6. The electronic device according to claim 1, wherein the electronic device is capable of acting as a camera.

7. The electronic device according to claim 1, wherein the electronic device is a mobile phone.

8. The method according to claim 3, wherein the first switching element includes a p-type MOSFET, and the second switching element includes a n-type MOSFET.

9. The method according to claim 3, wherein the electronic device is capable of acting as a camera.

10. The method according to claim 3, wherein the electronic device is a mobile phone.

11. An electronic device comprising:
a first switching element connected between a power source and one end of a power inductor;
a second switching element connected between the one end of the power inductor and ground;
a detection unit that detects a current flowing to the second switching element and generates a current detection signal from the detected current; and
a control unit that gradually increases an on-resistance of the second switching element when the second switching element is changed from an on-state to an off-state,
wherein the control unit controls a rise time of a gate voltage of the second switching element when the control unit gradually increases the on-resistance of the second switching element,
wherein the control unit determines a driving mode corresponding to the rise time of the gate voltage of the second switching element, based on the current detection signal generated by the detection unit,
wherein the control unit causes a selector to select a resistor corresponding to the driving mode from among resistors,
wherein the control unit supplies a driving signal to a gate of the second switching element via the resistor selected by the selector, and
wherein the control unit includes the selector and the resistors.

12. The electronic device according to claim 11, wherein when the first switching element is in an off-state and the second switching element is in the off-state, a load current flows through a loop of the power inductor, a load of the electronic device, ground, and a parasitic diode of the second switching element.

13. The electronic device according to claim 11, wherein the first switching element includes a p-type MOSFET, and the second switching element includes a n-type MOSFET.

14. The electronic device according to claim 11, wherein the electronic device is capable of acting as a camera.

15. The electronic device according to claim 11, wherein the electronic device is a mobile phone.

16. A method performed in an electronic device including a first switching element connected between a power source and one end of a power inductor and a second switching element connected between the one end of the power inductor and ground, the method comprising:
   causing a detection unit to detect a current flowing to the second switching element and generate a current detection signal from the detected current;
   causing a control unit to gradually increase an on-resistance of the second switching element when the second switching element is changed from an on-state to an off-state;
   causing the control unit to control a rise time of a gate voltage of the second switching element when the control unit gradually increases the on-resistance of the second switching element;
   causing the control unit to determine a driving mode corresponding to the rise time of the gate voltage of the second switching element, based on the current detection signal generated by the detection unit;
   causing a selector to select a resistor corresponding to the driving mode from among resistors; and
   causing the control unit to supply a driving signal to a gate of the second switching element via the resistor selected by the selector,
   wherein the electronic device includes the detection unit and the control unit, and the control unit includes the selector and the resistors.

17. The method according to claim 16, wherein when the first switching element is in an off-state and the second switching element is in the off-state, a load current flows through a loop of the power inductor, a load of the electronic device, ground, and a parasitic diode of the second switching element.

18. The method according to claim 16, wherein the first switching element includes a p-type MOSFET, and the second switching element includes a n-type MOSFET.

19. The method according to claim 16, wherein the electronic device is capable of acting as a camera.

20. The method according to claim 16, wherein the electronic device is a mobile phone.

* * * * *